(12) United States Patent
Dastidar

(10) Patent No.: US 7,502,979 B2
(45) Date of Patent: Mar. 10, 2009

(54) PIPELINED SCAN STRUCTURES FOR TESTING EMBEDDED CORES

(75) Inventor: Jayabrata Ghosh Dastidar, San Jose, CA (US)

(73) Assignee: Altera Corporation, San Jose, CA (US)

( * ) Notice: Subject to any disclaimer, the term of this patent is extended or adjusted under 35 U.S.C. 154(b) by 93 days.

(21) Appl. No.: 11/150,354

(22) Filed: Jun. 10, 2005

(65) Prior Publication Data

US 2006/0282729 A1 Dec. 14, 2006

(51) Int. Cl.
*G01R 31/28* (2006.01)
(52) U.S. Cl. ....................................... 714/729
(58) Field of Classification Search ........................ None
See application file for complete search history.

(56) References Cited

U.S. PATENT DOCUMENTS

| | | | |
|---|---|---|---|
| 4,780,874 A * | 10/1988 | Lenoski et al. | 714/726 |
| 6,362,015 B1 | 3/2002 | Whetsel | |
| 6,539,491 B1 | 3/2003 | Skergan et al. | |
| 6,691,270 B2 | 2/2004 | Blasco Allue et al. | |
| 6,700,581 B2 | 3/2004 | Baldwin et al. | |
| 6,861,866 B2 * | 3/2005 | Han | 326/16 |
| 7,051,255 B2 * | 5/2006 | Gschwind | 714/726 |

FOREIGN PATENT DOCUMENTS

WO WO99/14611 3/1999

OTHER PUBLICATIONS

Australian Search and Exam Report date Mar. 26, 2008 in related Singapore Patent Application No. 200603965-5 ( 8 pages).

* cited by examiner

*Primary Examiner*—Christine T Tu
(74) *Attorney, Agent, or Firm*—Weaver Austin Villeneuve & Sampson LLP

(57) ABSTRACT

A scan testing technique in which test data is pipelined to scan logic within an integrated circuit. In system on a programmable chip (SOPC) designs, pipelines are easily built in the programmable logic device (PLD) logic by configuring programmable interconnects to connect registers in a pipelined manner so that test data can be pipelined to scan the logic under test. In system on a chip (SOC) designs, a smart test generator-analyzer is configured to recursively extract pipeline information from a design-so that test data can be pipelined to scan the logic under test. Generally, test data is pipelined using existing functional logic and/or scan chains. Furthermore, a failure analysis (FA) platform is described. The FA platform is operable to take as its input a failing vector as well as a pipelined scan vector and unroll the pipeline sequence to determine which vector caused the failure.

28 Claims, 11 Drawing Sheets

US 7,502,979 B2

PIPELINED SCAN STRUCTURES FOR TESTING EMBEDDED CORES

BACKGROUND

1. Technical Field

The present invention relates to integrated circuit testing, and more particularly, to scan testing of integrated circuits.

2. Description of Related Art

During design of an integrated circuit, the design (typically a software modeled design) is extensively tested for proper functioning. The testing at this stage of development is known as design verification testing. Although integrated circuit designs are thoroughly tested during the design phase, once the integrated circuits are fabricated, they must be individually tested for manufacturing defects as well as for operation and functionality.

Referring to FIG. 1, one popular method for providing individual testing is referred to as "scan testing" in which test data (e.g., input test data vector 110a; output test data vector 112a) is shifted through serially connected registers 102a (e.g., input-side registers 102a(1-3); output-side registers 102a(4-6)) on the input-side and output-side of a logic 104a under test within an integrated circuit 100. Input-side registers 102a(1-3) are connected in series to form a shift register known as a scan chain 101a, which is connected to access ports 106a(1-2) via interconnects 108a(1-4). Similarly, output-side registers 102a(4-6) form another scan chain 101b, which is connected to access ports 106a(3-4) via interconnects 108a(11-14). After input-side registers 102a(1-3) are loaded with input test data via access port 106a and interconnects 108a(1-3), the input test data is applied to logic 104a via interconnects 108a(5-7) in generating corresponding output test data, which is captured in output-side registers 102a(4-6) via interconnects 108a(8-10). This output test data (e.g., output test data vector 112a) is then serially shifted out via access port 106a4 and interconnects 108a(12-14) from output-side registers 102a(4-6) for observation.

The speed at which scan testing can be performed generally depends on how quickly input test data is applied to the logic and how quickly corresponding output test data from the logic is received for observation. For example, referring again to FIG. 1, three clock cycles are required to load the three 1-bit input-side registers 102a(1-3) with a 3-bit input test data (e.g., 1,0,1). An additional clock cycle is required for applying the input test data from input-side registers 102a(1-3) to logic 104a and for output-side registers 102a(4-6) to receive a corresponding 3-bit output test data (e.g., 0,0,1) from logic 104a. Then, three clock cycles are further required for shifting out the output test data from output-side registers 102a(4-6). That is, a total of seven clock cycles are required for applying the input test data vector to the logic and for receiving the corresponding output test data vector for observation. If the logic is to undergo further scan testing, another seven clock cycles would be needed to apply each subsequent input test data vector in series to the logic and for receiving the corresponding output test data vector for observation. As such, scan testing can be a very time consuming process, especially as the number of input-side or output-side registers of a scan chain is increased.

In a system on a chip (SOC) or system on a programmable chip (SOPC), there may be multiple blocks of logic or embedded cores that can only be accessed through scan at their input and output access ports for test purposes. For example, embedded blocks with tight timing margins may only be accessed through scan at their input and output access ports and not immediately at their internal registers. Since scan testing involves a serial operation where each test data vector is shifted in only after the previous test data vector is shifted out for observation, scan testing time is exacerbated for these types of blocks or cores.

Thus, there is a need for techniques and mechanisms that can improve the speed at which scan testing of manufactured integrated circuits can be implemented, thereby improving the scan testing time.

SUMMARY

The present invention relates to improved scan testing techniques and mechanisms in which test data is pipelined to scan logic within an integrated circuit. The invention may be implemented in numerous ways. For example, in SOPC designs, pipelines are easily built in the programmable logic device (PLD) logic by configuring programmable interconnects to connect registers in a pipelined manner so that test data can be pipelined to scan the logic under test. In SOC designs, a smart test generator-analyzer is configured to recursively extract pipeline information from a design so that test data can be pipelined to scan the logic under test. In various cases, test data is pipelined using existing functional logic and/or scan chains.

In addition, the present invention relates to a failure analysis (FA) platform. Generally, the FA platform is operable to take as its input a failing vector as well as a pipelined scan vector and unroll the pipeline sequence to determine which vector caused the failure.

In one aspect, the present invention provides a method for scan testing logic within an integrated circuit. Input test data is shifted in parallel into multiple input-side scan chains. The input test data is applied from the multiple input-side scan chains to a logic under test. The output test data from the logic under test is captured in multiple output-side scan chains and shifted out in parallel. At least two of the input-side and output-side scan chains are on different levels of a pipeline.

In another aspect, the present invention provides an integrated circuit having logic for scan testing. The integrated circuit includes a logic under test as well as multiple input-side and output-side scan chains. The multiple input-side scan chains are operable to receive input test data in parallel as well as to make available the input test data for applying to the logic under test. The multiple output-side scan chains are operable to receive output test data from the logic under test and to make available the output test data for observation from the output-side scan chains in parallel. At least two input-side and output-side scan chains are on different levels of a pipeline.

In yet another aspect, the present invention provides a system for failure analysis of a semiconductor device. The system includes an integrated circuit, a smart test generator-analyzer, a mapping, a failing output test data vector, and an input test data vector. The integrated circuit includes a logic under test, multiple input-side scan chains, and multiple output-side scan chains. The smart test generator-analyzer produces the mapping of pipeline information between the multiple input-side and output-side scan chains. Based on the mapping, the input test data vector at an input-side scan chain corresponds to the failing output test data vector at an output-side scan chain. The input test data vector is correlated with a failure in the integrated circuit.

Accordingly, the present invention can provide many benefits. The present invention can leverage off existing functional logic and scan chains, thereby minimizing the impact to die costs. Also, the present invention can significantly reduce scan testing time depending on the depth (e.g., number of levels or stages) of the pipeline built. For example, if a pipeline of depth 5 is built, then 5 separate input/output scan vectors can be merged to a single equivalent input/output scan vector, thereby cutting down test application time by a factor of approximately five times. The present invention recognizes that the reduction in the number of scan operations can significantly cut down on scan testing time. Although the present invention may be implemented for scan testing any design, it is particularly useful for scan testing complex designs.

These and other features and advantages of the present invention will be presented in more detail in the following specification of the invention and the accompanying figures, which illustrate by way of example the principles of the invention.

BRIEF DESCRIPTION OF THE DRAWINGS

The invention may best be understood by reference to the following description taken in conjunction with the accompanying drawings, which illustrate specific embodiments of the present invention.

DETAILED DESCRIPTION OF SPECIFIC EMBODIMENTS

Figure 1:
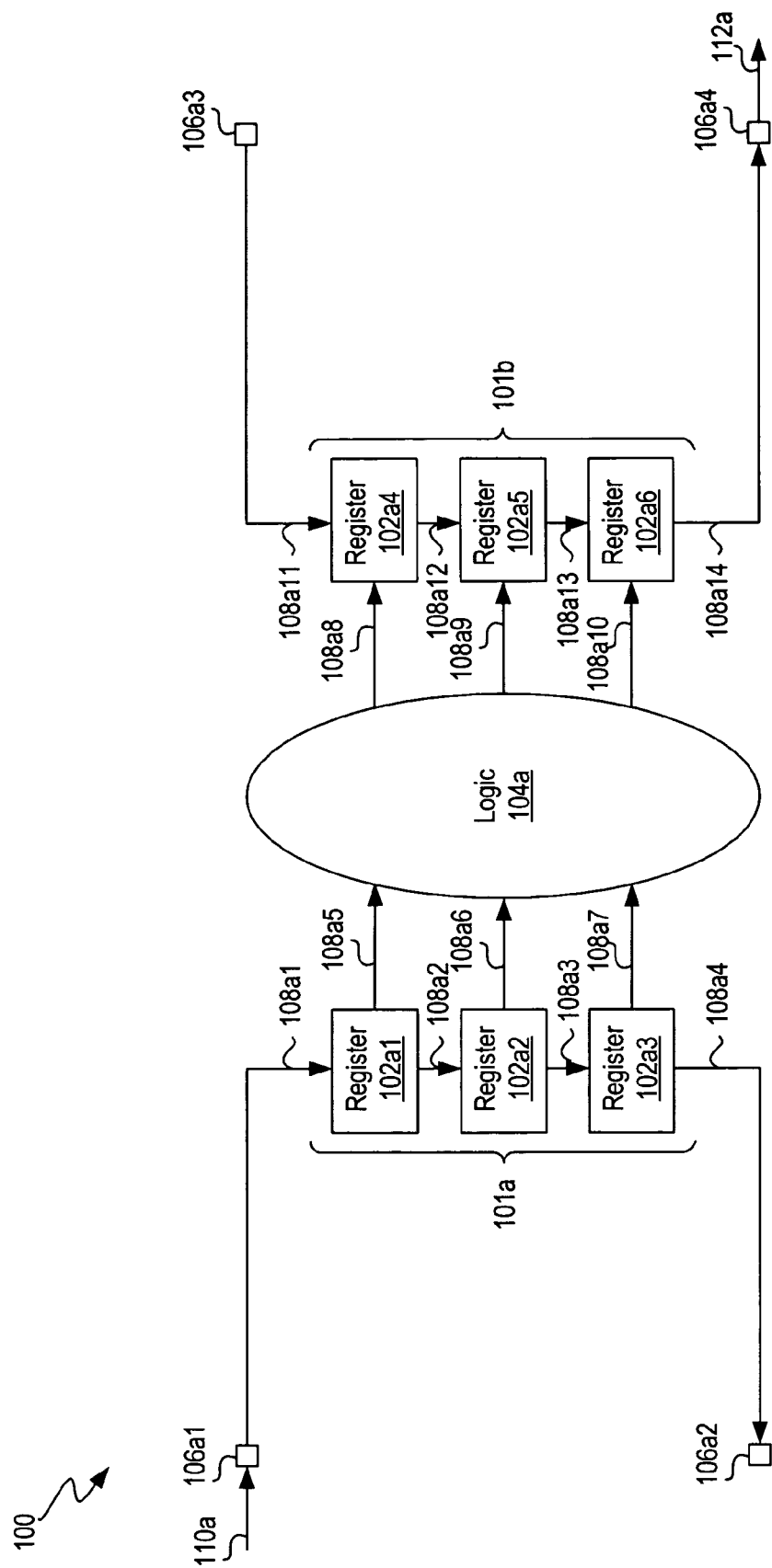
FIG. 1 illustrates an integrated circuit that is operable for scan testing logic.

Reference will now be made in detail to some specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

However, it should be noted that the techniques of the present invention can be applied to a variety of types of devices. In the following description, numerous specific details are set forth in order to provide a thorough understanding of the present invention. The present invention may be practiced without some or all of these specific details. In other instances, well known process operations have not been described in detail in order not to unnecessarily obscure the present invention. Furthermore, techniques and mechanisms of the present invention will sometimes be described in singular form for clarity. However, it should be noted that some embodiments can include multiple iterations of a technique or multiple instantiations of a mechanism unless noted otherwise.

Overview

The present invention is applicable to standard integrated circuits, custom integrated circuits (e.g., ASICs, ASSPs), and programmable integrated circuits. Integrated circuits that may be programmable by a customer to produce a custom design for that customer include programmable logic devices (PLDs). Programmable logic devices refer to any integrated circuit that may be programmed to perform a desired function and include programmable logic arrays (PLAs), programmable array logic (PAL), field programmable gate arrays (FPGA), complex programmable logic devices (CPLDs), and a wide variety of other logic and memory devices that may be programmed. Often, such PLDs are designed and programmed by a design engineer using an electronic design automation tool that takes the form of a software package.

In SOC or SOPC designs, there are generally multiple blocks of logic (e.g., embedded cores) that can only be accessed through scan testing at their access ports (e.g., input and output ports). An example is an embedded memory. Another example is an embedded block with a tight timing margin that does not allow its internal registers to be scanned. Scan testing is a serial operation and is usually the most expensive part of testing integrated circuits. Reducing the number of scan operations can significantly cut down on scan testing time.

Accordingly, the present invention provides improved scan testing techniques and mechanisms in which test data is pipelined to scan logic within an integrated circuit. For example, in SOPC designs, pipelines are easily built in the programmable logic device (PLD) logic by configuring programmable interconnects to connect registers in a pipelined manner so that test data can be pipelined to scan the logic under test. In SOC designs, a smart test generator-analyzer is configured to recursively extract pipeline information from an ASIC so that test data can be pipelined to scan the logic under test. Generally, test data is pipelined using existing functional logic and/or scan chains. In addition, the present invention provides a failure analysis (FA) platform. The FA platform is operable to take as its input a failing vector as well as a pipelined scan vector and unroll the pipeline sequence to determine which vector caused the failure.

Many advantages and benefits can be realized with the present invention. The present invention can leverage off existing functional logic and scan chains, thereby, minimizing the impact to die costs. Also, the present invention can significantly reduce scan testing time depending on the depth (e.g., number of levels or stages) of the pipeline built. For example, if a pipeline of depth 5 is built, then 5 separate scan vectors can be merged to a single equivalent scan (e.g., where the merged vector shifts through the scan path); thereby, cutting down test application time by a factor of approxi-

Scan Chain Example

Figure 2:
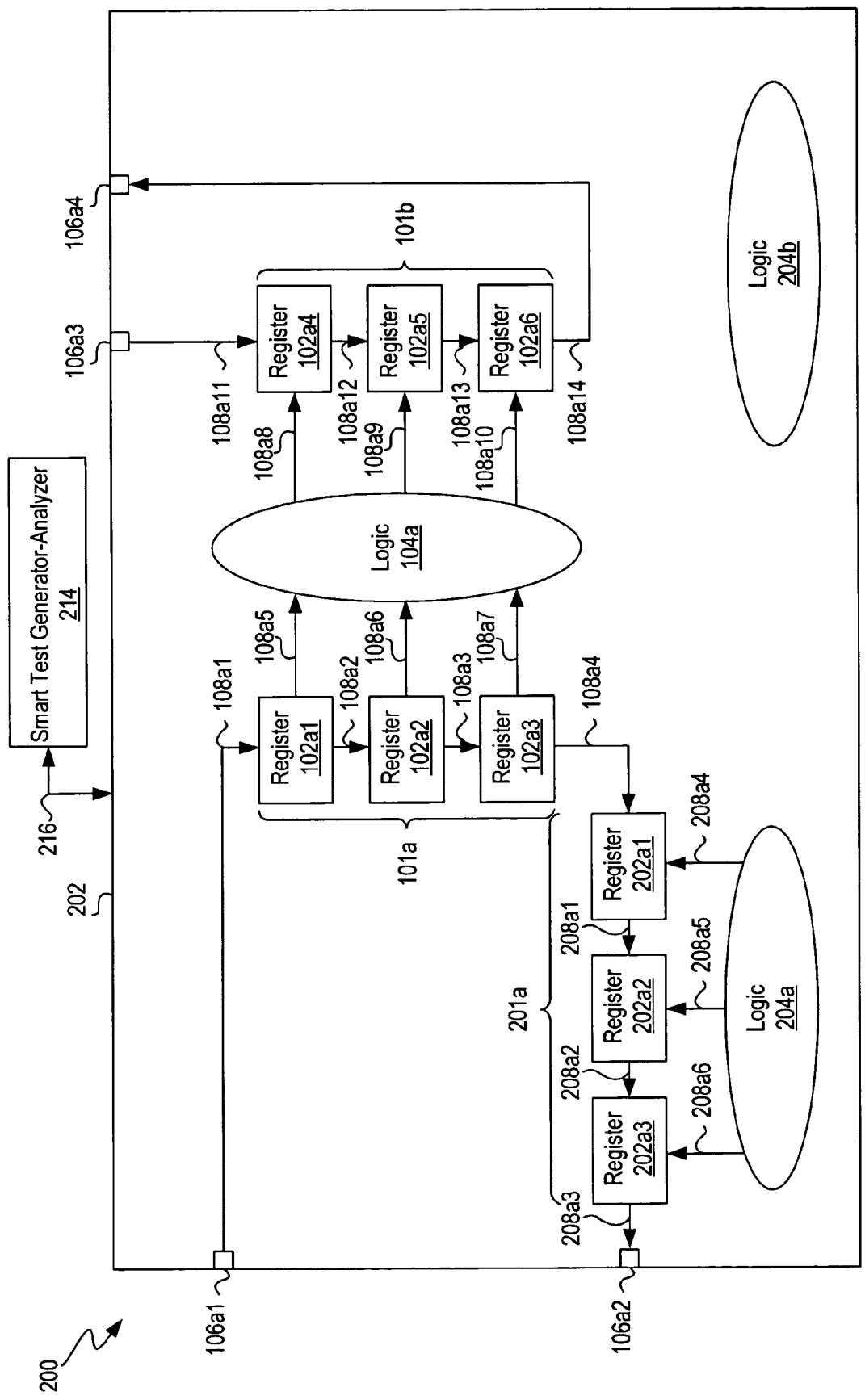
FIG. 2 illustrates a manufactured integrated circuit that is operable for scan testing logic according to various embodiments of the present invention.

FIG. 2 illustrates a manufactured integrated circuit 200 that is operable for scan testing logic 104a according to various embodiments of the present invention. In addition to the logic under test (i.e., logic 104a), integrated circuit 200 may include any number of other logic 204a and 204b within an integrated circuit package 202. Logic 104a, 204a, and 204b may each represent any portion and type of integrated circuit logic. For example, logic 104a is a block of combinatorial logic or an embedded memory core.

Any individual group or collective set of groups of serially connected registers is referred to herein as a scan chain. A scan chain can be associated with one or more logic blocks. As shown, scan chains 101a, 201a, and 101b are located on the input-side and output-side of logic 104a. Any scan chain on the input-side of logic 104a is generally referred to herein as an input-side scan chain. Similarly, any scan chain on the output-side of logic 104a is generally referred to herein as an output-side scan chain. However, in some embodiments, only the scan chains in the scan testing path are considered in making this distinction. Scan chains can be implemented using any conventional mechanism or technique.

Every scan chain is typically associated with a pair of access ports (e.g., 106a(1-2); 106a(3-4)). In some instances, the pair of access ports belongs only to an individual scan chain. In other instances, the pair of access ports is shared by multiple scan chains. The pair of access ports allows test data to be shifted in and out of the scan chains. The pair of access ports also allows testing of the scan chain itself. For example, a break in a scan chain can be detected by shifting in test data through one access port and observing it out of the other access port.

Interconnects are used to connect together various components of integrated circuit 200. For example, interconnects 108a(1-4), 108a(11-14), and 208a(1-3) are used to connect the registers of the scan chains 101a, 101b, and 201a to their corresponding access ports. Interconnects 108a(5-7) are used to connect the input-side scan chain 101a (e.g., containing registers 102a(1-3)) to logic 104a while interconnects 108a(8-10) are used to connect the output-side scan chain 101b (e.g., containing registers 102a(4-6)) to logic 104a. In addition, interconnects 208a(4-6) are used to connect the scan chain 201a containing registers 202a(1-3) to logic 204a. The arrows on the interconnects indicate the direction of the general data flow.

In a typical scan testing path, input test data is shifted through access port 106a1 to the input-side scan chain 101a via interconnects 108a(1-3). The input test data is then shifted into logic 104a via interconnects 108a(5-7) in generating output test data along interconnects 108a(8-10). The output test data is captured in the output-side scan chain 101b. The output test data can then be shifted out from output-side scan chain 101b through access port 106a4 via interconnects 108a(12-14). It should be noted that input-side or output-side scan chains may be connected to other scan chains (e.g., scan chain 201a) that are not directly connected to logic 104a or within the test scanning path of logic 104a.

A smart test generator-analyzer 214 is operable to send and receive test data and other control signals with integrated circuit 200 via interconnect 216 and/or access ports 106a(1-4). Smart test generator-analyzer 214 is also operable to analyze the output test data and conduct other scan testing functions such as mapping, correlation, and failure analysis functions as described below.

Detailed Pipeline Embodiments

Figure 3:
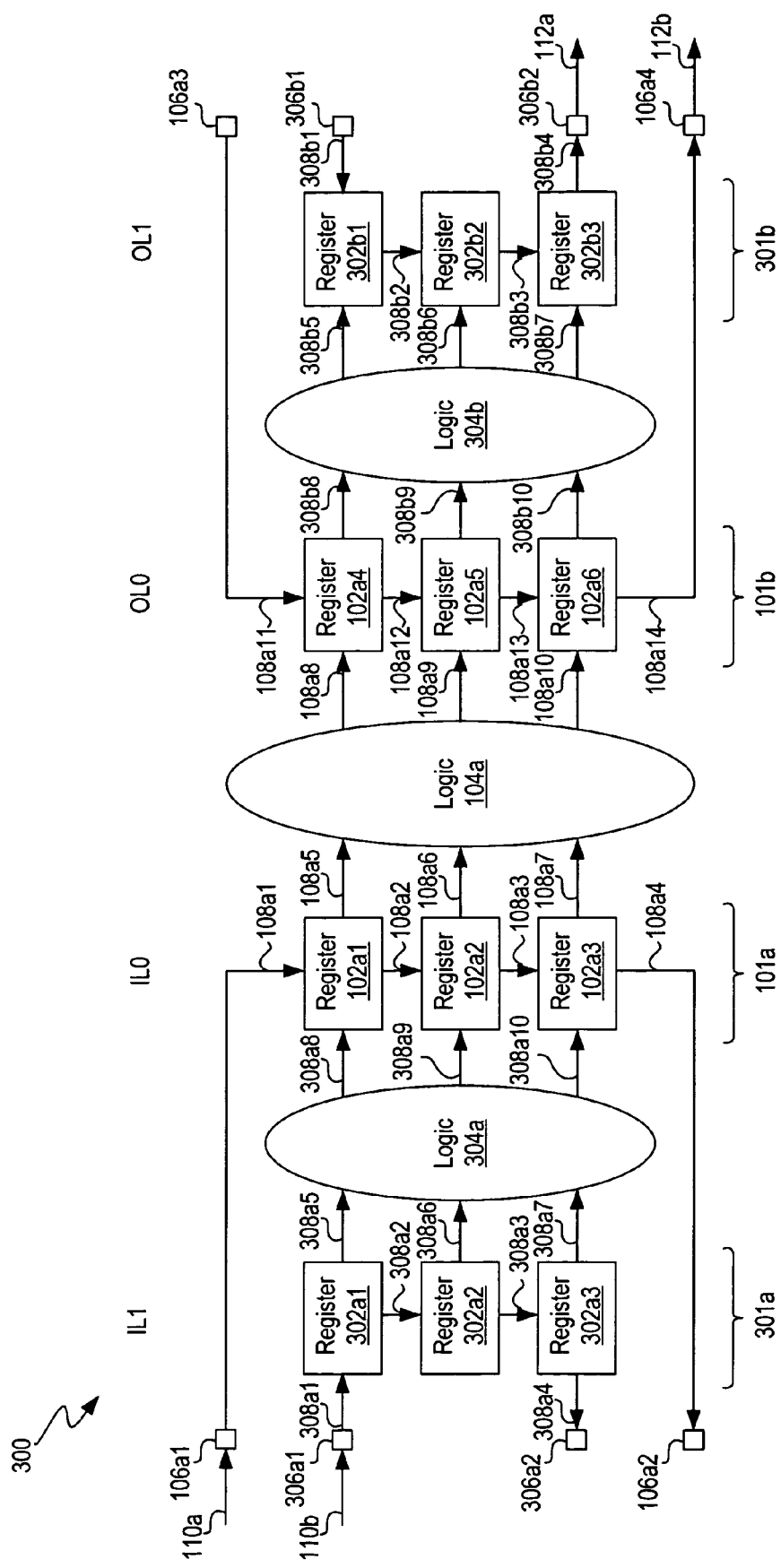
FIG. 3 illustrates an integrated circuit that is operable for scan testing logic using test data pipelining in accordance with a first embodiment of the present invention.

FIG. 3 illustrates an integrated circuit 300 that is operable for scan testing logic 104a using test data pipelining in accordance with a first embodiment of the present invention. Integrated circuit 300 is based on a SOC design implemented on an ASIC. As shown, integrated circuit 300 includes two input-side scan chains (i.e., scan chain 101a containing registers 102a(1-3); scan chain 301a containing registers 302a(1-3)) and two output-side scan chains (i.e., scan chain 101b containing registers 102a(4-6); scan chain 301b containing registers 302b(1-3)). Each scan chain is associated with corresponding access ports (e.g., 101a with 106a(1-2); 301a with 306a(1-2); 101b with 106a(3-4); 301b with 306b(1-2)) via interconnects (e.g., 108a(1-4); 308a(1-4); 108a(11-14); 308b(1-4)).

Input-side scan chains 101a and 301a are operable to receive and store input test data vectors 110a and 110b in parallel via access ports 106a1 and 306a1. The stored input test data vectors are available from input-side scan chains 101a and 301a for applying to the logic under test 104a. The two input-side scan chains are each on a different input level (IL) of a pipeline. For instance, input-side scan chain 101a is on IL0 (input level 0) and input-side scan chain 301a is on IL1 (input level one).

Output-side scan chains 101b and 301b are operable to receive and store output test data vectors 112a and 112b from the logic under test 104a. The stored output test data vectors are available from the output-side scan chains 101b and 301b for observation by shifting them out in parallel via access ports 306b2 and 106a4. The two output-side scan chains are each on a different output level (OL) of a pipeline. For instance, output-side scan chain 101b is on OL0 and output-side scan chain 301b is on OL1.

Multiple interconnects (e.g., 108a(5-10)) are used for connecting the two input-side scan chains and the two output-side scan chains to the logic under test 104a. Since scan chains are typically interweaved between various logic in an integrated circuit design, input-side scan chains 301a and 101a are shown connected to logic 304a via interconnects 308a(5-10). Similarly, output-side scan chains 301b and 101b are shown connected to logic 304b via interconnects 308b(5-10).

In a scan testing operation, input test data vectors 110a and 110b are shifted in parallel into scan chains 101a and 301a respectively. Since scan chains 101a and 301 a have three registers each, three clock cycles are required to load them with their respective input test data vectors. In the next clock cycle, input test data vector 110a is applied to logic 104a in generating an output test data vector 112a that is captured in output-side scan chain 101b. In the same clock cycle, input test data vector 110b is applied to logic 304a where a resulting input test data vector 110b appears at scan chain 101a. In another clock cycle, the resulting input test data vector 110b is applied to logic 104a in generating an output test data vector 112b that is captured in output-side scan chain 101b. In the same clock cycle, output test data vector 112a is applied to logic 304b where a resulting output test data vector 112a appears at scan chain 301b. Finally, three cycles are required to shift out in parallel output test data vectors 112a and 112b for observation. Thus, a total of eight clock cycles are required for scan testing logic 104a with two input test data vectors. Conventionally, at least fourteen clock cycles (seven clock cycles for each input test data vector applied in a series operation) would be required for scan testing 104a with two input test data vectors.

It should be noted that output test data vectors 112a and 112b are based on the input test data vectors 110a and 110b respectively. However, since output test data vectors 112a and 112b are the result of being translated/conditioned by logic in addition to the logic under test, the translations/conditionings should be accounted for in performing the scan testing and in analyzing the scan testing results. Any technique and mechanism may be employed to facilitate the mapping or translation of logic in the scan path.

Since input and output test data vectors are shifted in and out in parallel of input-side and output-side scan chains over multiple pipeline levels, pipelining of test data is realized. Accordingly, scan testing time is reduced, especially when there are many registers that form the scan chains. For instance, by loading multiple input test data vectors in parallel into the input-side scan chains, multiple input test data vectors can be loaded at substantially the same time (e.g., synchronously loading registers of multiple scan chains on every clock cycle). As such, a subsequent input test data vector is preloaded and ready to be applied to the logic under test. According to some embodiments, the subsequent input test data vector can be applied to the logic under test at one cycle after a prior input test data vector has been applied.

Conventionally, before a subsequent input test data vector can be loaded into the input-side scan chain, it must wait until the prior input test data vector is completely loaded into the input-side scan chain, applied to the logic under test in generating an output test data vector that is captured in the output-side scan chain, and the output test data vector shifted out for observation. An increase in test scanning time is exacerbated as the number of registers in the scan chain increases. It should be noted that in the present invention, the application of each input test data vector to the logic under test is still done in a serial manner. That is, one input test data vector is applied to logic 104a before another input test data vector is subsequently applied. However, the present invention allows each input test data vector to be applied to logic 104a in a serial manner using a pipeline.

Figure 4:
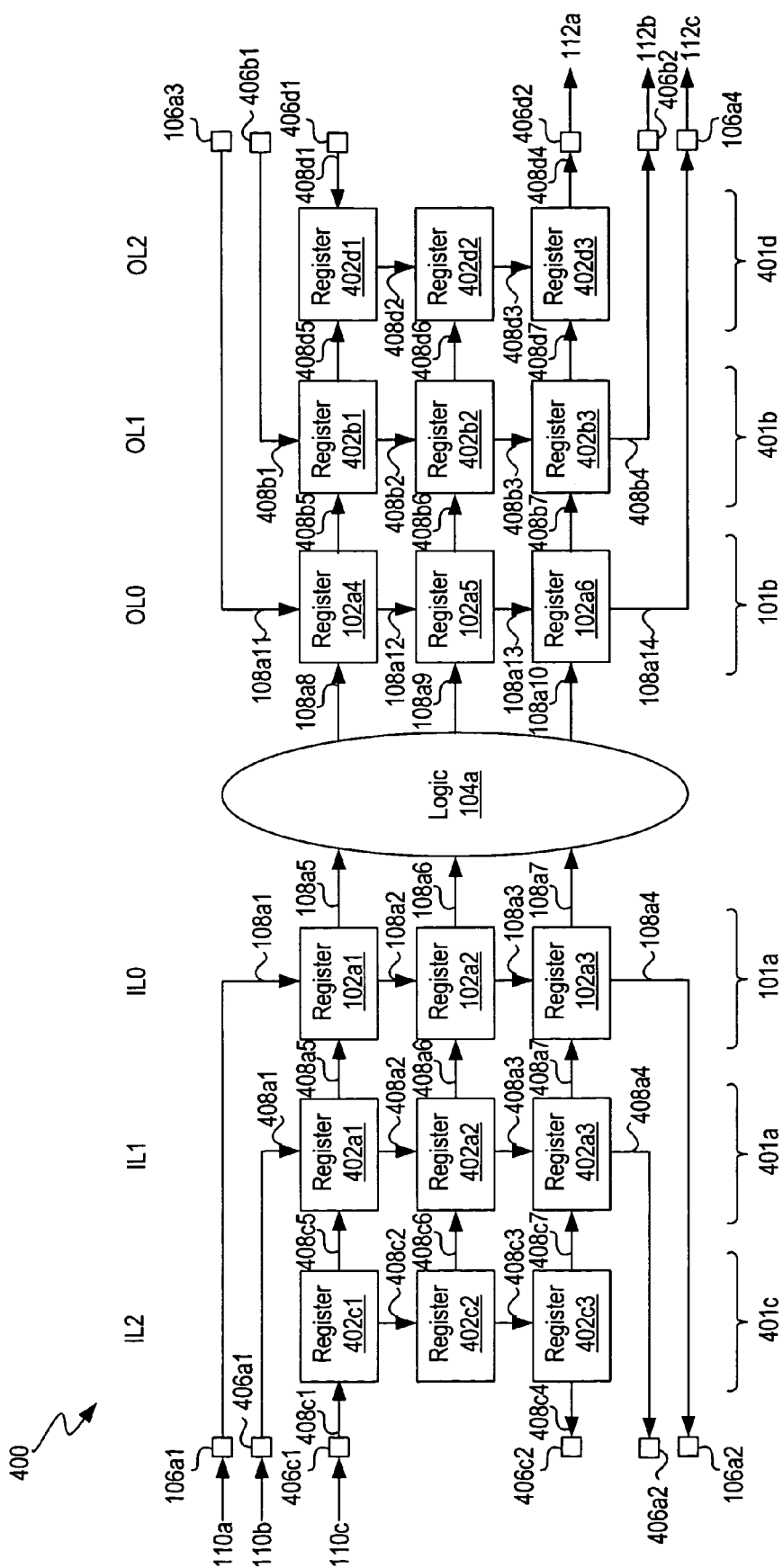
FIG. 4 illustrates an integrated circuit that is operable for scan testing logic using test data pipelining in accordance with a second embodiment of the present invention.

FIG. 4 illustrates an integrated circuit 400 that is operable for scan testing logic using test data pipelining in accordance with a second embodiment of the present invention. Integrated circuit 400 is based on a SOPC design implemented on a programmable device (e.g., PLD). As shown, integrated circuit 400 includes three input-side scan chains (i.e., scan chain 101a containing registers 102a(1-3); scan chain 401a containing registers 402a(1-3); scan chain 401c containing registers 402c(1-3)) and three output-side scan chains (i.e., scan chain 101b containing registers 102a(4-6); scan chain 401b containing registers 402b(1-3); scan chain 401d containing registers 402d(1-3)). Each scan chain is associated with corresponding access ports (e.g., 101a with 106a(1-2); 401a with 406a(1-2); 401c with 406c(1-2); 101b with 106a(3-4); 401b with 406b(1-2); 401d with 406d(1-2)) via interconnects (e.g., 108a(1-4); 408a(1-4); 408c(1-4); 108a(11-14); 408b(1-4); 408d(1-4)).

Input-side scan chains 101a, 401a, and 401c are operable to receive and store input test data vectors 110a, 110b, and 110c in parallel via access ports 106a1, 406a1, and 406c1. The stored input test data vectors are available from input-side scan chains 101a, 401a, and 401c for applying to the logic under test 104a. As shown, the three input-side scan chains 101a, 401a, and 401c are respectively on IL0, IL1, and IL2 of a pipeline.

Output-side scan chains 101b, 401b, and 401d are operable to receive and store output test data vectors 112a, 112b, and 112c from the logic under test 104a. The stored output test data vectors are available from the output-side scan chains 101b, 401b, and 401d for observation by shifting them out in parallel via access ports 406d2, 406b2, and 106a4. As shown, the three output-side scan chains 101b, 401b, and 401d are respectively on OL0, OL1, and OL2 of a pipeline.

Multiple interconnects (e.g., 108a(5-10)) are used for connecting the three input-side scan chains and the three output-side scan chains to the logic under test 104a. Although scan chains are typically interweaved between various logic in an integrated circuit design, programmable interconnects in programmable devices allow scan chains in to be directly connected together in forming the pipeline. As such, the translation/mapping of test data vectors between scan chains is minimized. In some embodiments, the only logic in the scan testing path is the logic under test. As shown, input-side scan chains 401c and 401a are connected with interconnects 408c(5-7) and input-side scan chains 401a and 101a are connected with interconnects 408a(5-7). Similarly, output-side scan chains 101b and 401b are connected with interconnects 408b(5-7) and output-side scan chains 401b and 401d are connected with interconnects 408d(5-7).

Programmable interconnects allow easy construction of pipeline formations of scan chains in programmable devices. As compared to ASICs or ASSPs, test data vector translations of logic between scan chains can be minimized with programmable interconnects. This is because programmable interconnects can be implemented to bypass unwanted logic (i.e., logic that is unnecessary for the scan testing). Once scan chains are identified either by reference to a mapping or netlist of the integrated circuit, a pipeline can be constructed with programmable interconnects so that test data can be pipelined when scan testing.

In a scan testing operation, input test data vectors 110a, 110b, and 110c are shifted in parallel into scan chains 101a, 401a, and 401c respectively. Since scan chains 101a, 401a, and 401c have three registers each, three clock cycles are required to load them with their respective input test data vectors. In the next clock cycle (i.e. fourth clock cycle), input test data vector 110a is applied to logic 104a in generating an output test data vector 112a that is captured in output-side scan chain 101b. In the same clock cycle, input test data vector 110b is shifted from scan chain 401a into scan chain 101a and input test data vector 110c is shifted from scan chain 401c into scan chain 401a. In another clock cycle (i.e., fifth clock cycle), input test data vector 110b is applied to logic 104a in generating an output test data vector 112b that is captured in output-side scan chain 101b. In the same clock cycle, input test data vector 110c is shifted from scan chain 401a into scan chain 101a and output test data vector 112a is shifted from scan chain 101b into scan chain 401b. In another clock cycle (i.e., sixth clock cycle), input test data vector 110c is applied to logic 104a in generating an output test data vector 112c that is captured in output-side scan chain 101b. In the same clock cycle, output test data vector 112b is shifted from scan chain 101b into scan chain 401b and output test data vector 112a is shifted from scan chain 401b into scan chain 401d. Finally, three cycles are required to shift out in parallel output test data vectors 112a, 112b, and 112c for observation. Thus, a total of nine clock cycles are required for scan testing logic 104a with three input test data vectors in this specific embodiment. Conventionally, at least twenty-one clock cycles (seven clock cycles for each input test data vector applied in a series operation) would be required for scan testing logic 104a with three input test data vectors.

Since input and output test data vectors are shifted in and out in parallel of input-side and output-side scan chains over multiple pipeline levels, pipelining of test data is again realized. Accordingly, scan testing time is reduced. The reduction in scan testing time is dependent on the number of levels in the pipeline. For instance, a 10-level pipeline may save scan time by a factor of approx 10. This is because scan chains may contain numerous registers where a clock cycle is needed to load every individual register. If loading or unloading of test data is done in parallel, the time savings can be significant. According to various embodiments, the time savings is at least as much as it takes to load the scan chain with the most registers.

As mentioned, loading and unloading is where the time savings are greatest. This is because individual test data vectors can be merged together for the loading and unloading operations. Further, it is possible to overlap in time the unloading of one set of test data vectors and the loading of another set of test data vectors. That is, as one set of vectors is being shifted out for observation, another set of vectors is being loaded at substantially the same time. However, application of the test data vectors to the logic is still done on an individual basis.

It is also possible to overlap in time the unloading of a first individual test data vector and the loading of a second individual test data vector. For example, as mentioned earlier, the conventional method involves a serial operation where each test data vector is shifted in only after the previous test data vector is shifted out for observation. However, the serial operation may be configured to include overlapping the loading and unloading of individual vectors. To further elaborate, a comparison between the conventional method with overlap and the pipelined method with overlap of the present invention is provided below.

Based on the conventional method with overlap, scan testing with eight test data vectors and one input-side (500 registers) and one output-side scan chain (500 registers) would require 500+1+500+1+500+1+500+1+500+1+500+1+500+1+500+1+500=4508 cycles. That is, (500 cycles to shift in vector 1) plus (1 cycle to apply vector 1 to the logic and get a corresponding output vector 1) plus (500 cycles to shift out corresponding output vector 1 and shift in vector 2 simultaneously) plus (1 cycle to apply vector 2 to the logic and get a corresponding output vector 2) plus (500 cycles to shift out corresponding output vector 2 and shift in vector 3 simultaneously) plus (1 cycle to apply vector 3 to the logic and get a corresponding output vector 3) plus (500 cycles to shift out corresponding output vector 3 and shift in vector 4 simultaneously) plus (1 cycle to apply vector 4 to the logic and get a corresponding output vector 4) plus (500 cycles to shift out corresponding output vector 4 and shift in vector 5 simultaneously) plus (1 cycle to apply vector 5 to the logic and get a corresponding output vector 5) plus (500 cycles to shift out corresponding output vector 5 and shift in vector 6 simultaneously) plus (1 cycle to apply vector 6 to the logic and get a corresponding output vector 6) plus (500 cycles to shift out corresponding output vector 6 and shift in vector 7 simultaneously) plus (1 cycle to apply vector 7 to the logic and get a corresponding output vector 7) plus (500 cycles to shift out corresponding output vector 7 and shift in vector 8 simultaneously) plus (1 cycle to apply vector 8 to the logic and get a corresponding output vector 8) plus (500 cycles to shift out corresponding output vector 8), thereby totaling 4508 cycles.

Based on the pipelined method with overlap of the present invention, scan testing with eight test data vectors and 4 input-side scan chains (500 registers per input-side scan chain) and 4 output-side scan chains (500 registers per output-side scan chain) over a 4 level pipeline (i.e., IL0, IL1, IL2, IL3 and OL0, OL1, OL2, OL3) would require 500+4+500+4+500=1508 cycles. That is, (500 cycles to shift in vectors 1-4 in parallel) plus (4 cycles to apply vectors 1-4 to the logic and get corresponding output vectors 1-4) plus (500 cycles to shift out corresponding output vectors 1-4 and shift in vectors 5-8 simultaneously) plus (4 cycles to apply vectors 5-8 to the logic and get corresponding output vectors 5-8) plus (500 cycles to shift out corresponding output vectors 5-8), thereby totaling 1508 cycles. In comparison, the conventional method with overlap requires approximately 3× more scan testing time over the pipelined method with overlap. In other words, the pipelined method with overlap of the present invention provides a 3× reduction in scan testing time over the conventional method with overlap. Of course, further reduction in scan testing time may be provided over the conventional method without overlap.

Figure 5:
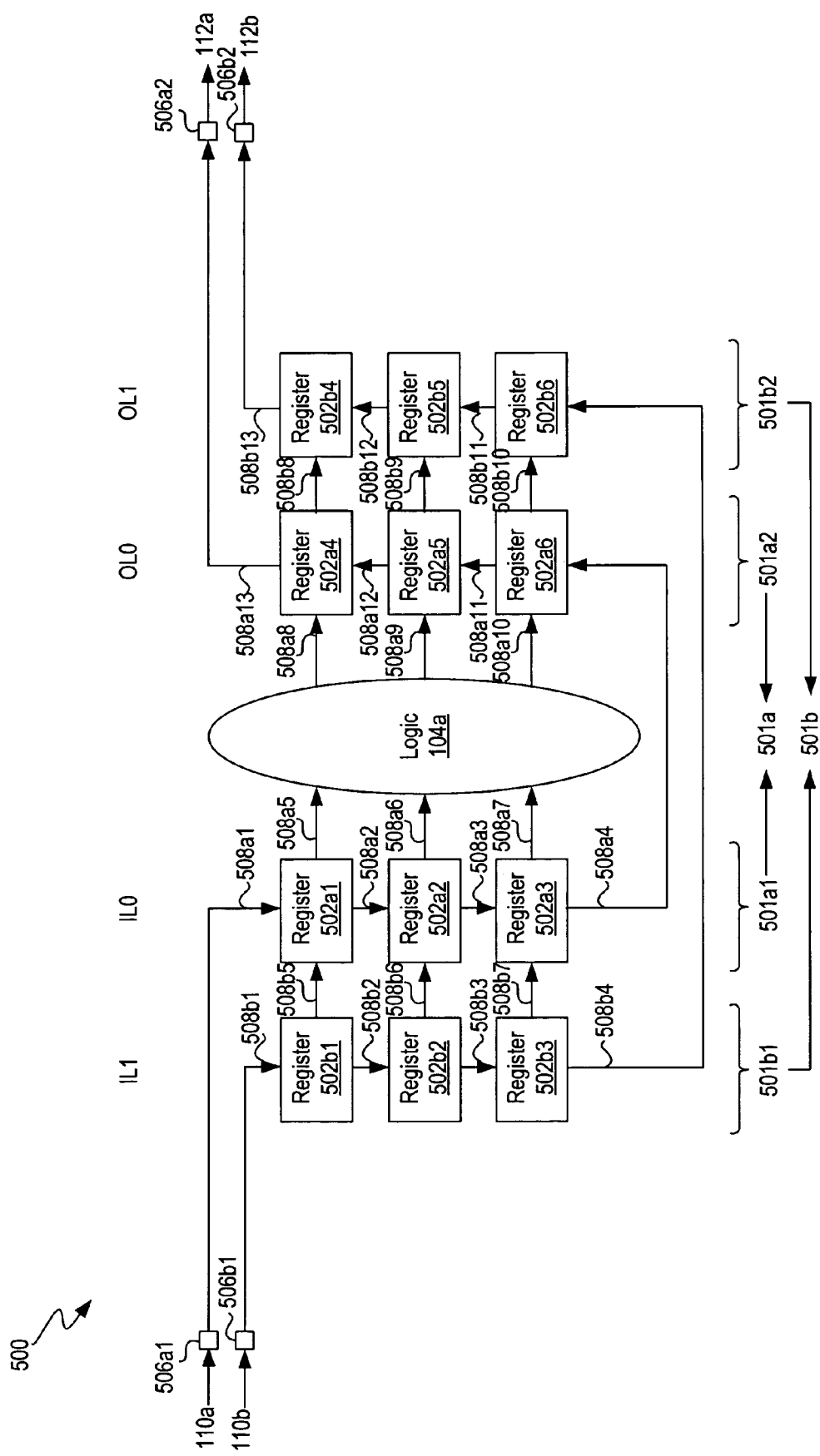
FIG. 5 illustrates an integrated circuit that is operable for scan testing logic using test data pipelining in accordance with a third embodiment of the present invention.

FIG. 5 illustrates an integrated circuit that is operable for scan testing logic using test data pipelining in accordance with a third embodiment of the present invention. Integrated circuit 500 is based on a SOPC design implemented on a programmable device (e.g., PLD). As shown, integrated circuit 500 includes two input-side scan chains (i.e., scan chain 501*a* 1 containing registers 502*a*(1-3); scan chain 501*b*1 containing registers 502*b*(1-3)) and two output-side scan chains (i.e., scan chain 501*a*2 containing registers 502*a*(4-6); scan chain 501*b*2 containing registers 502*b*(4-6)). Input-side scan chain 501*a* 1 and output-side scan chain 501*a*2 are constituents of scan chain 501*a*. Likewise, input-side scan chain 501*b*1 and output-side scan chain 501*b* 2 are constituents of scan chain 501*b*. In other words, scan registers on the input and output sides of logic 104*a* can be on the same scan chain (e.g., 501*a*; 501*b*). Each scan chain is associated with corresponding access ports (e.g., 501*a* (501*a*1 and 501*a*2) with 506*a*(1-2); 501*b*(501*b*1 and 501*b*2) with 506*b*(1-2)) via interconnects (e.g., 508*a*(1-4); 508*a*(11-13); 508*b*(1-4); 508*b*(11-13)).

Input-side scan chains 501*a*1 and 501*b*1 are operable to receive and store input test data vectors 110*a* and 110*b* in parallel via access ports 506*a*1 and 506*b*1. The stored input test data vectors are available from input-side scan chains 501*a*1 and 501*b*1 for applying to the logic under test 104*a*. As shown, the two input-side scan chains 501*a*1 and 501*b*1 are respectively on IL0 and IL1 of a pipeline.

Output-side scan chains 501*a*2 and 501*b*2 are operable to receive and store output test data vectors 112*a* and 112*b* from the logic under test 104*a*. The stored output test data vectors are available from the output-side scan chains 501*a*2 and 501*b*2 for observation by shifting them out substantially in parallel via access ports 506*a*2 and 506*b*2. As shown, the two output-side scan chains 501*a*2 and 501*b*2 are respectively on OL0 and OL1 of a pipeline.

Multiple interconnects (e.g., 508*a*(5-10)) are used for connecting the two input-side scan chains and the two output-side scan chains to the logic under test 104*a*. Although scan chains are typically interweaved between various logic in an integrated circuit design, programmable interconnects in programmable devices allow scan chains in to be directly connected together in forming the pipeline. As such, the translation/mapping of test data vectors between scan chains is minimized. In some embodiments, the only logic in the scan testing path is the logic under test. As shown, input-side scan chains 501*a*1 and 501*b*1 are connected with interconnects 508*b*(5-7). Similarly, output-side scan chains 501*a*2 and 501*b*2 are connected with interconnects 508*b*(8-10).

In a scan testing operation, input test data vectors 110a and 110b are shifted in parallel into scan chains 501a1 and 501b1 respectively. Since scan chains 501a1 and 501b1 have three registers each, three clock cycles are required to load them with their respective input test data vectors. In the next clock cycle (i.e. fourth clock cycle), input test data vector 110a is applied to logic 104a in generating an output test data vector 112a that is captured in output-side scan chain 501a2. In the same clock cycle, input test data vector 110b is shifted from scan chain 501b1 into scan chain 501a1. In another clock cycle (i.e., fifth clock cycle), input test data vector 110b is applied to logic 104a in generating an output test data vector 112b that is captured in output-side scan chain 501a2. In the same clock cycle, output test data vector 112a is shifted from scan chain 501a2 into scan chain 501b2. Finally, three clock cycles are required to shift out in parallel output test data vectors 112a and 112b for observation. Thus, a total of eight clock cycles are required for scan testing logic 104a with two input test data vectors in this specific embodiment. Conventionally, at least fourteen clock cycles (seven clock cycles for each input test data vector applied in a series operation) would be required for scan testing logic 104a with two input test data vectors.

It will be appreciated by those skilled in the art that test patterns (e.g., test data vectors) can be efficiently applied at different speeds over any portion of the scan testing, thereby improving the quality and/or efficiency of the scan testing. It should be noted that pipelining the scan chains permits the scan testing to be segmented into different portions for handling test patterns with different clocks and/or at different speeds. For example, pipelining the scan chains allows the application of test patterns to the logic under test at functional speed. Functional speed includes the speed at which the logic under test normally operates, which often corresponds to the system clock/speed. For another example, loading and unloading of the pipeline can be performed at a slower speed than the speed at which the test patterns are applied to the logic under test. Test patterns may be applied to the logic under test using a fast clock at system speed.

Flow Diagrams

Figure 6:
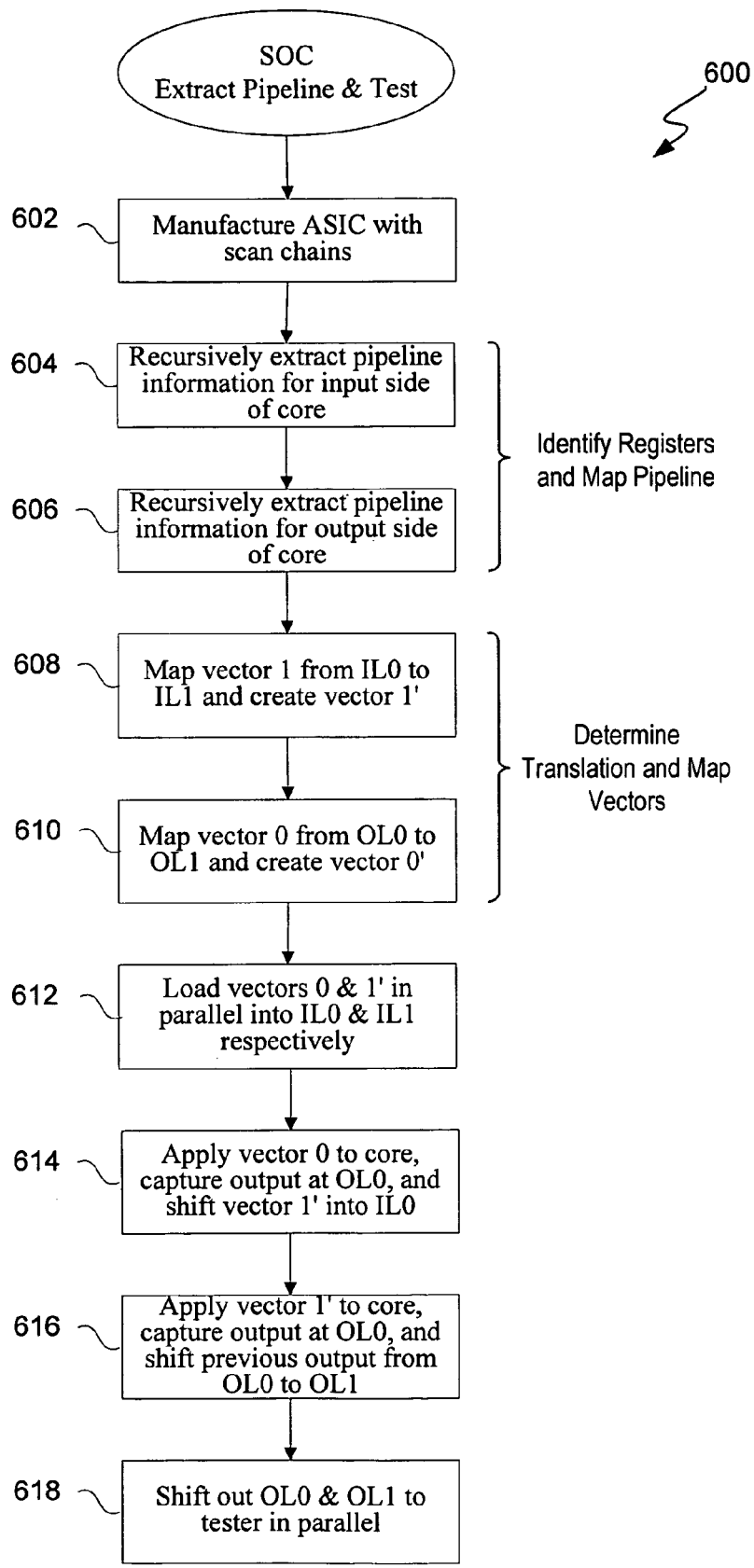
FIG. 6 is a flow diagram for scan testing logic in a SOC design.

FIG. 6 is a flow diagram 600 for scan testing logic based on FIG. 3. At operation 602, an integrated circuit is manufactured with scan chains. The integrated circuit is implemented as either an ASIC or ASSP and contains a SOC design. At operation 604, pipeline information is recursively extracted for the input-side of the core/logic under test. Similarly, pipeline information is recursively extracted for the output-side of the core/logic under test at operation 606. In both operations 604 and 606, registers/scan chains at different levels from the core/logic under test are identified. According to various embodiments, identification of registers/scan chains is conducted from the inner levels to the outer levels of the logic under test. These levels may be correlated with particular levels of a pipeline. That is, both operations 604 and 606 allow mapping of a pipeline by identifying among other things the registers/scan chains associated with the core/logic under test.

At operation 608, vector 1 is mapped from the registers/scan chain at IL0 to the registers/scan chain at IL1 to create vector 1'. For example, referring to FIG. 3, a determination (i.e., mapping) is made as to what vector (i.e., vector 1') is needed in scan chain 301a in order for logic 304a to generate a known vector 1 in scan chain 101a. At operation 610, vector 0 is mapped from the registers/scan chains at OL0 to the registers/scan chains at OL1 to create vector 0'. For example, referring again to FIG. 3, a determination (i.e., mapping) is made as to what vector (i.e., vector 0') at scan chain 301b would be generated by logic 304b based on inputting a known vector 0 from scan chain 101b. Both operations 608 and 610 determine the translation of logic other than the core/logic under test. That is, both operations 608 and 610 allow mapping of test data vectors (see FIGS. 8 and 9 and corresponding description below).

At operation 612, vectors 0 & 1' are loaded in parallel into registers/scan chains at IL0 and IL1 respectively. At operation 614, vector 0 is applied to the core/logic in generating an output that is captured at the registers/scan chain at OL0. Further, vector 1' is shifted into the registers/scan chain at IL0. At operation 616, vector 1' is applied to the core/logic in generating an output that is captured at the registers/scan chain at OL0. Further, the previous output is shifted from the registers/scan chain at OL0 to the registers/scan chain at OL1. Finally, the data from the registers/scan chains at OL0 and OL1 are shifted out in parallel to a tester (e.g., smart test generator-analyzer 214) for observation in operation 618.

By having a mapping of the pipeline and the test data vectors, test data pipelining is realized. In particular, the mapping allows the analysis of output test data to take into account the effects of logic in addition to the logic under test in the scan path. Any suitable mechanism or technique may be used for performing the mapping operations. For example, a smart test generator-analyzer 214 may be used.

Figure 7:
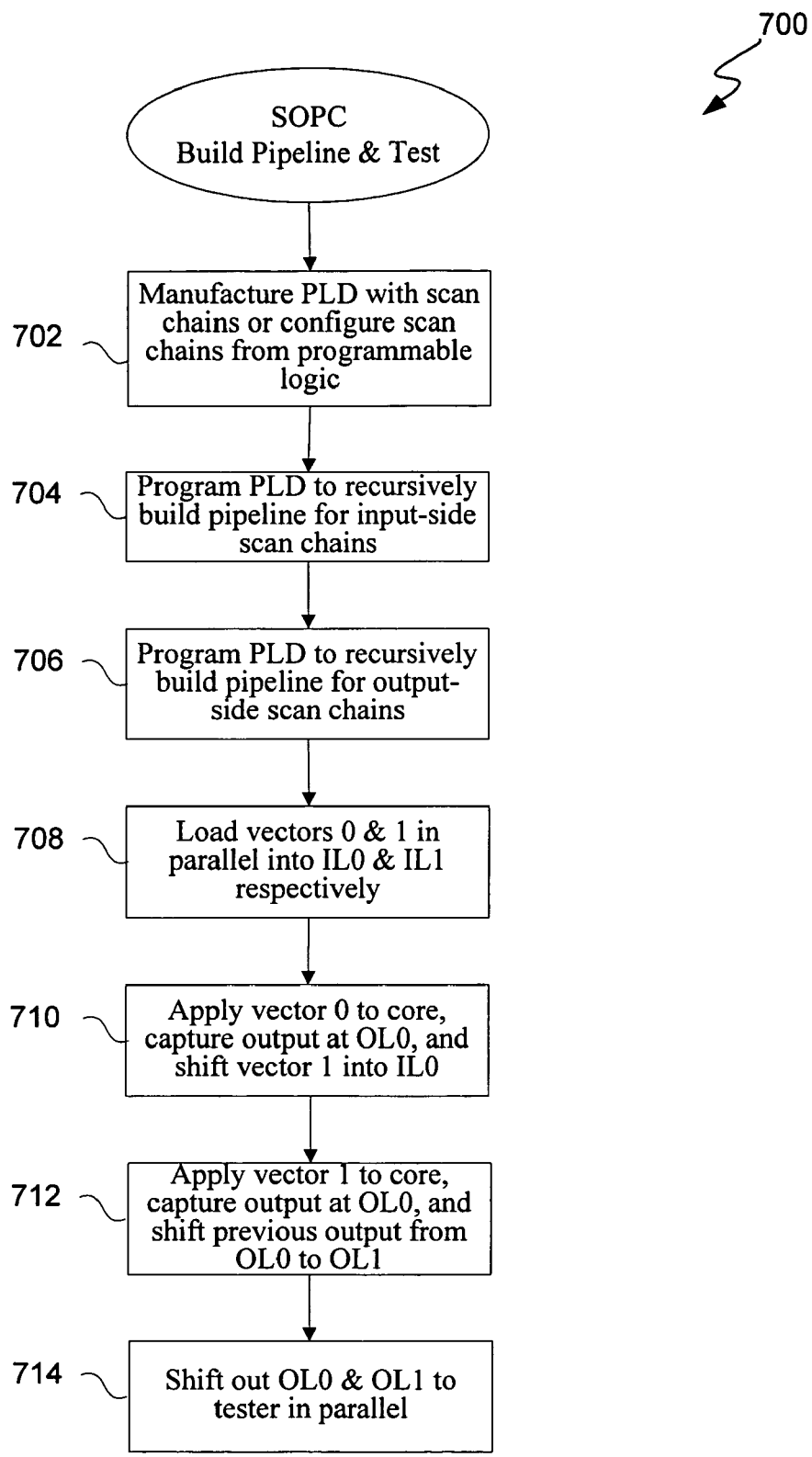
FIG. 7 is a flow diagram for scan testing logic in a SOPC design.

FIG. 7 is a flow diagram 700 for scan testing logic based on FIG. 4. At operation 702, an integrated circuit is manufactured with scan chains or an integrated circuit is to be configured with scan chains from programmable logic. The integrated circuit is implemented on a programmable device such as a PLD. At operation 704, the PLD is programmed to recursively build a pipeline for the input-side scan chains. For example, progressing from the inner level (e.g., IL0) to the outer level (e.g., IL1) of the pipeline, scan chains on the input-side of the logic under test would be interconnected with programmable interconnects. At operation 706, the PLD is programmed to recursively build a pipeline for the output-side scan chains. For example, progressing from the inner level (e.g., OL0) to the outer level (e.g., OL1) of the pipeline, scan chains on the output-side of the logic under test would be interconnected with programmable interconnects.

At operation 708, known vectors 0 and 1 are loaded in parallel into the scan chains at IL0 and IL1 respectively. At operation 710, vector 0 is applied to the core/logic under test in generating an output that is captured into the scan chain at OL0. Further, vector 1 is shifted into the scan chain at IL0. At operation 712, vector 1 is applied to the core/logic under test in generating an output that is captured at the scan chain at OL0. Further, the previous output is shifted from the scan chain at OL0 to the scan chain at OL1. Finally, the data in the scan chains at OL0 and OL1 are shifted out in parallel to a tester for observation in operation 714.

Extracting Pipeline Information Examples

Figure 8:
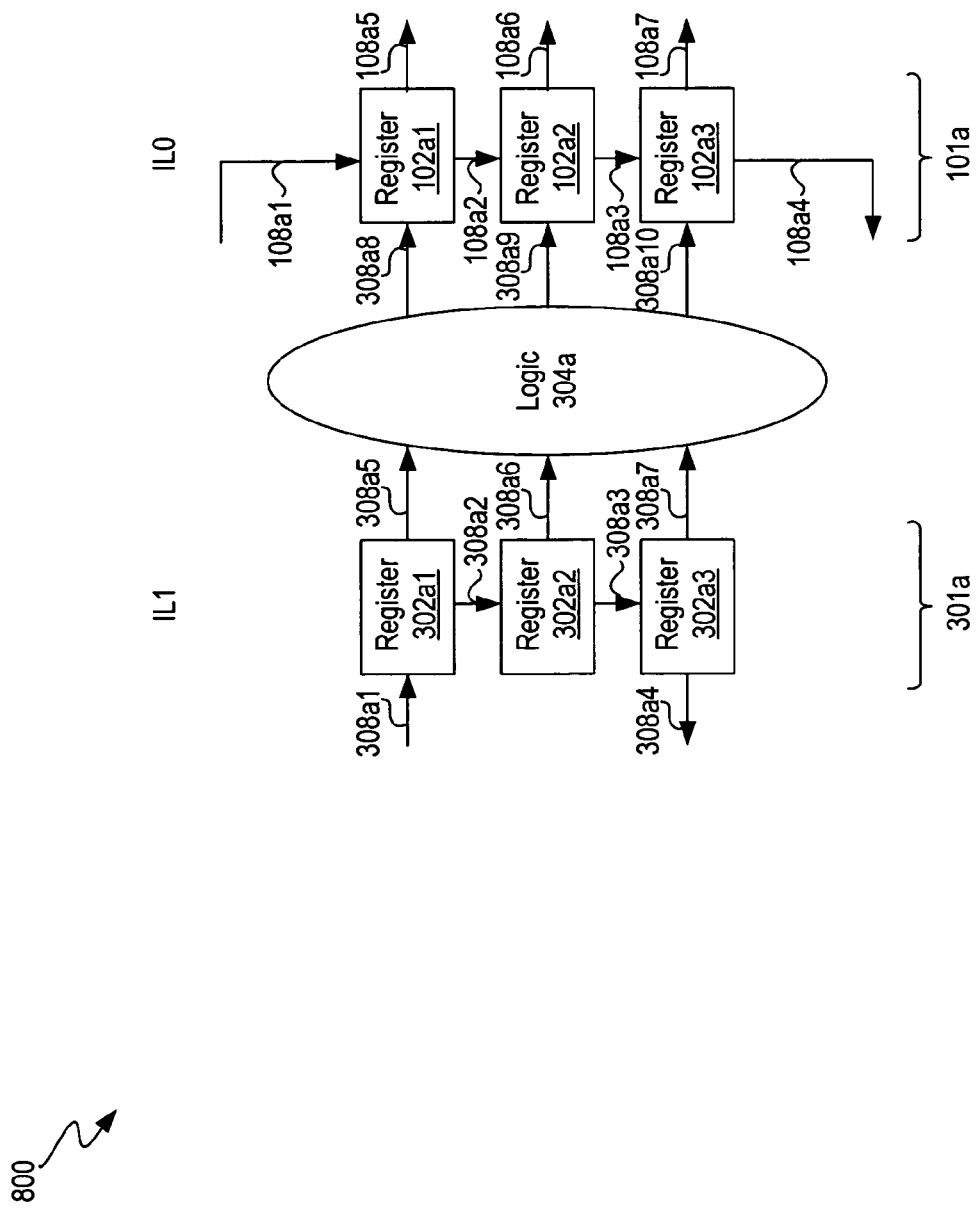
FIG. 8 illustrates an integrated circuit that includes pipeline information for extraction according to various embodiments of the present invention.

In general, any information relevant to the facilitation of test data pipelining is referred to herein as pipeline information. FIG. 8 illustrates an integrated circuit 800 that includes pipeline information for extraction according to various embodiments of the present invention. Integrated circuit 800 is actually a portion of integrated circuit 300. Since scan chain 101a receives the resulting test data vector from logic 304a, a correlation/mapping between the input test data vector and the resulting test data vector can be made. The correlation/mapping may be determined with the use of any conventional method or technique. The correlation/mapping includes the translation between an input test data vector and a resulting test data vector of logic 304a and identification of corresponding registers and/or scan chains on both sides of logic 304a. Other correlation/mapping for other levels of the pipeline may be similarly made. The smart test generator-analyzer mentioned above may be configured to determine the correlation/mapping.

Figure 9:
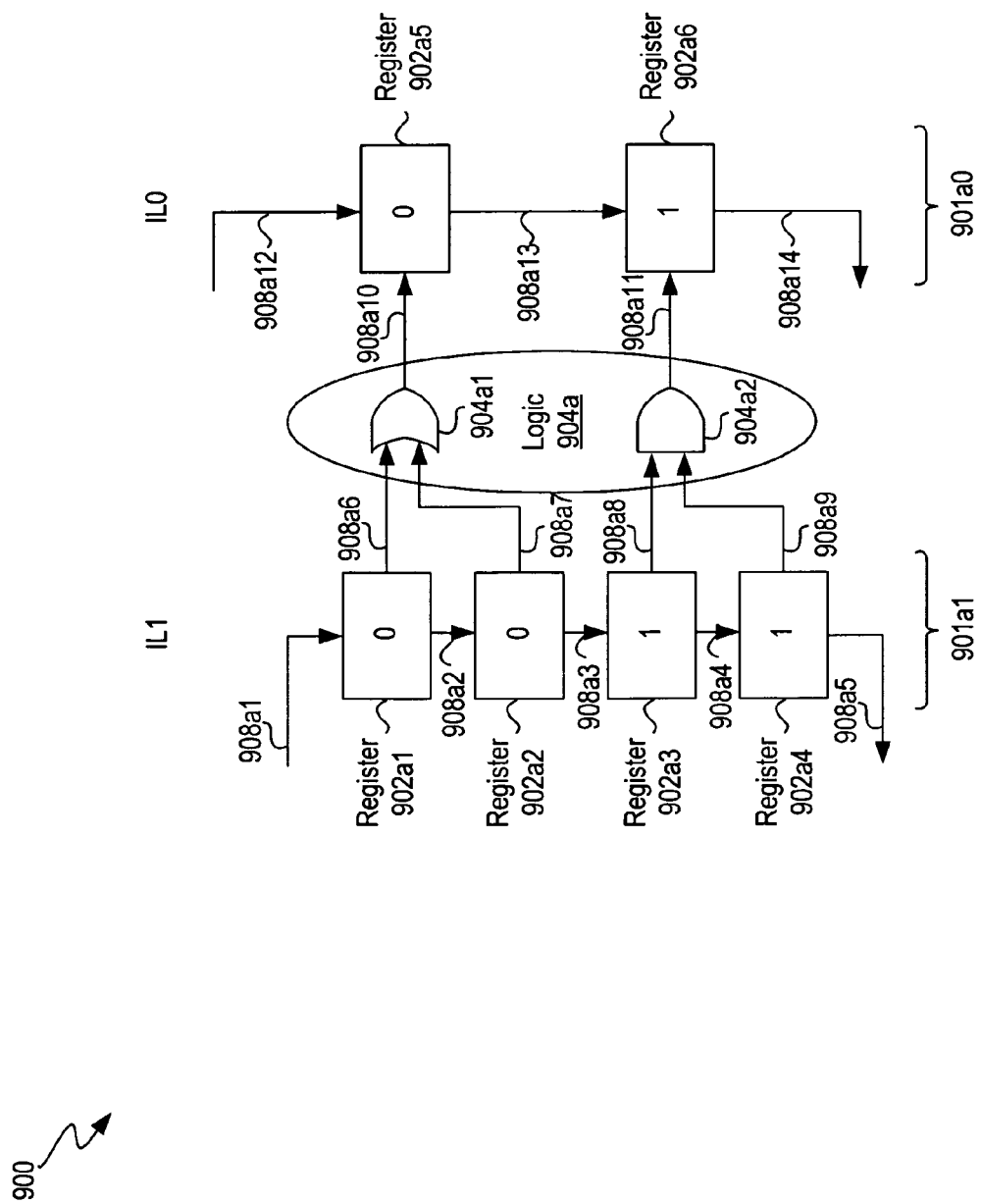
FIG. 9 illustrates an integrated circuit that includes pipeline information for extraction according to various embodiments of the present invention.

To further elaborate on the extraction of pipeline information, FIG. 9 illustrates an integrated circuit that includes pipeline information for extraction according to various embodiments of the present invention. Extraction of pipeline information may utilize any conventional mapping technique or mechanism for determining the logic translation of vectors. For example, a smart test generator-analyzer (e.g., 214) may be used for generating a translation mapping of vectors across logic 904a.

Based on certain known mapping variables, unknown mapping variables may be determined. For instance, given that logic 904a includes combinatorial logic having an "OR" logic element 904a1 and an "AND" logic element 904a2 and that a known test data vector (1,0) is provided in input-side scan chain 901a0, a determination or mapping of a corresponding test data vector (1,1,0,0) in input-side scan chain 901a1 can be performed. In general, once the registers for scan chains 901a0 and 901a1 are identified (including the number of registers in each scan chain), a translation mapping can be determined by using a known test data vector from scan chain 901a0 and knowledge of logic 904a to get the corresponding test data vector in scan chain 901a1.

By having a pipeline mapping and/or a vector mapping, a failure analysis (FA) platform or system may be implemented. According to various embodiments, a FA platform is operable to take as its input a failing vector as well as a pipelined scan vector and unroll the pipeline sequence to determine which vector caused the failure associated with a portion of the integrated circuit. For example, assume that there are two input-side scan chains SC1 and SC2 and two output-side scan chains SC3 and SC4. The scan chains SC1, SC2, SC3, and SC4 are each on a different pipeline level. Also assume that two input test data vectors V1 and V2 in scan chains SCI and SC2 have a corresponding two output test data vectors V3 and V4 in scan chains SC3 and SC4. Based on a mapping of the two input test data vectors to the two output test data vectors, a failure in one of the output test data vectors can be traced back to its corresponding input test data vector. Since each test data vector is associated with a particular scan chain located in the integrated circuit, the location of the failure in the integrated circuit can be identified. In general, failure analysis can be performed at an individual vector level. However, for a complex case such as where the pipeline stages share the same chain, it may require mapping of individual scan cells (i.e., register) to each test data vector.

Programmable Chip Example

Figure 10:
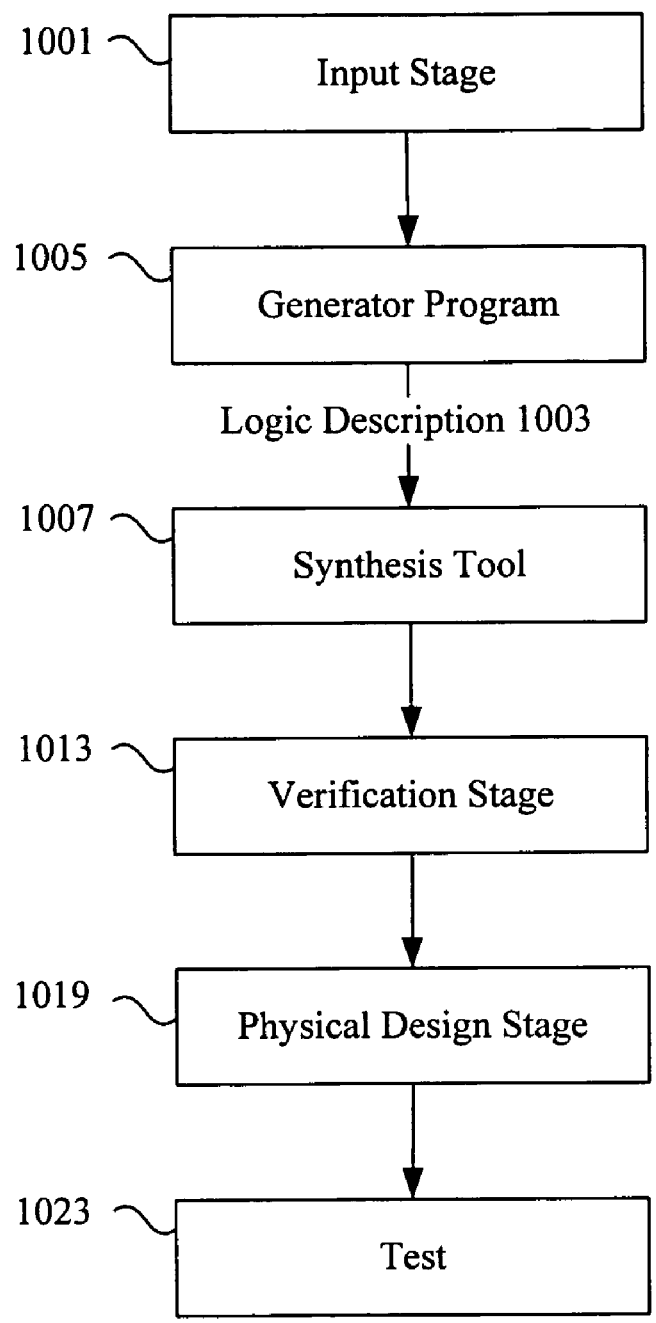
FIG. 10 is a flow diagram showing a technique for implementing a system on an electronic device.

FIG. 10 is a flow diagram showing a technique for implementing a system on an electronic device (e.g., programmable device). An input stage 1001 receives selection information typically from a user for logic (such as a processor core) as well as other components (such as a memory block and scan chains) to be implemented on an electronic device. In one example, the input received is in the form of a high-level language program. A generator program 1005 creates a logic description 1003 and provides the logic description along with other customized logic to any of a variety of synthesis tools, place and route programs, and logic configuration tools to allow a logic description to be implemented on an electronic device.

In one example, an input stage 1001 often allows selection and parameterization of components to be used on an electronic device. In some examples, components provided to an input stage include intellectual property functions, mega-functions, and intellectual property cores. The input stage 1001 may be a graphical user interface using wizards for allowing efficient or convenient entry of information. The input stage may also be a text interface or a program reading a data file such as a spreadsheet, database table, or schematic to acquire selection information. The input stage 1001 produces an output containing information about the various modules selected.

In typical implementations, the generator program 1005 can identify the selections and generate a logic description with information for implementing the various modules. The generator program 1005 can be a Perl script creating HDL files such as Verilog, Abel, VHDL, and AHDL files from the module information entered by a user. According to various embodiments, the generator program 1005 identifies scan chains and provides access ports for each scan chain. One tool with generator program capabilities is System on a Programmable Chip (SOPC) Builder available from Altera Corporation of San Jose, Calif. The generator program 1005 also provides information to a synthesis tool 1007 to allow HDL files to be automatically synthesized. In some examples, a logic description is provided directly by a designer. Hookups between various components selected by a user are also interconnected (e.g., via programmable interconnects) by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool 1007. The HDL files at this point may also be passed to a simulation tool.

As will be appreciated by one of skill in the art, the input stage 1001, generator program 1005, and synthesis tool 1007 can be separate programs. The interface between the separate programs can be a database file, a log, or simply messages transmitted between the programs. For example, instead of writing a file to storage, the input stage 1001 can send messages directly to the generator program 1005 to allow the generator program to create a logic description. Similarly, the generator program can provide information directly to the synthesis tool instead of writing HDL files. Similarly, input stage 1001, generator program 1005, and synthesis tool 1007 can be integrated into a single program.

A user may select various component modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 1007.

A synthesis tool 1007 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 1013 typically follows the synthesis stage 1007. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 1013, the synthesized netlist file can be provided to physical design tools 1019 including place and route and configuration tools. A place and route tool typically locates logic cells on specific logic elements of a target hardware device and connects wires between the inputs and outputs of the various logic elements in accordance with logic required to implement an electronic design. The device can also be physically tested at 1023.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used to implement various techniques of the present invention.

As noted above, different stages and programs can be integrated in a variety of manners. According to one embodiment, the input stage 1001, the generator program 1005, the synthesis tool 1007, the verification tools 1013, and physical design tools 1019 are integrated into a single program. The various stages are automatically run and transparent to a user. The program can receive the user selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

Figure 11:
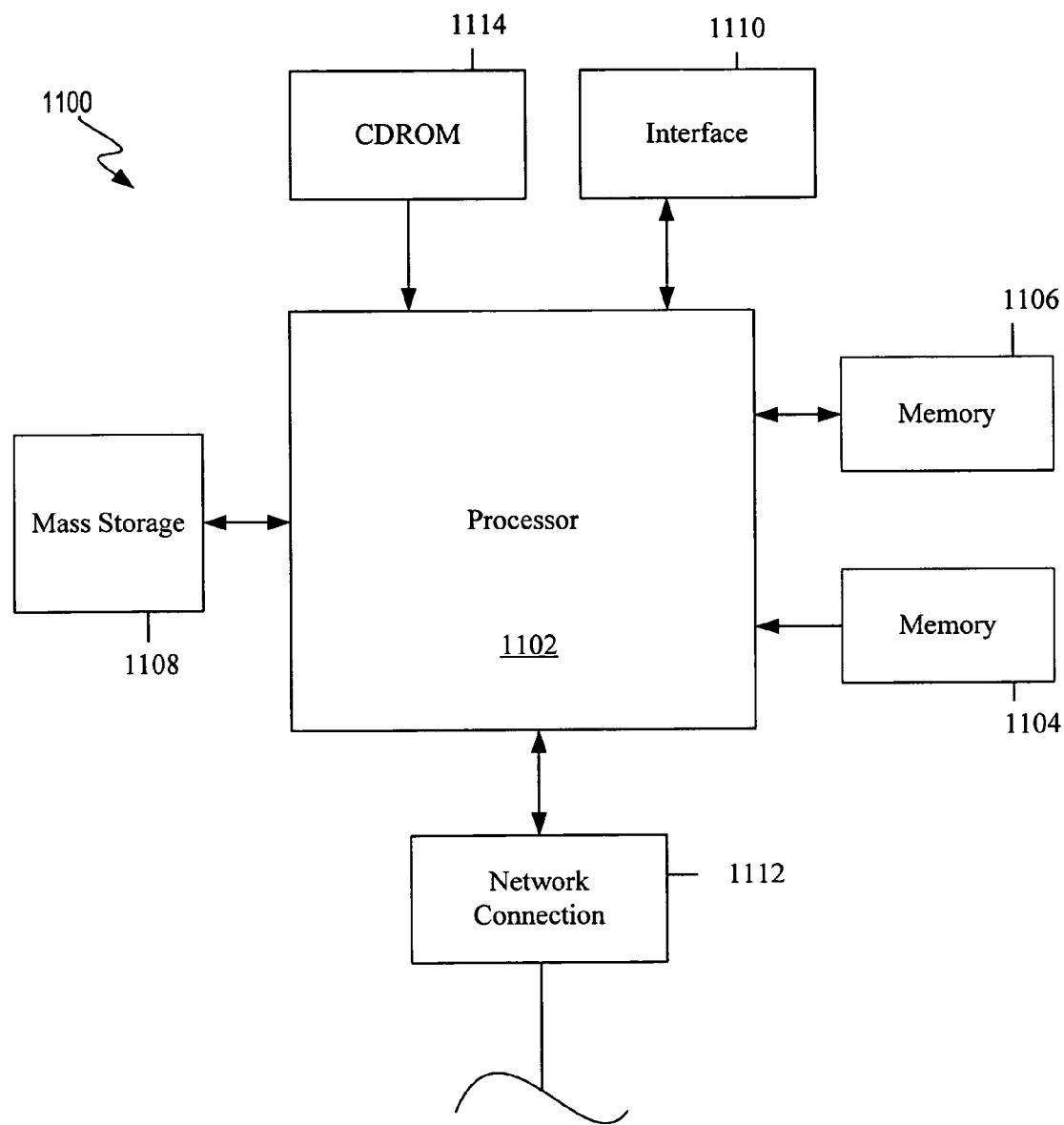
FIG. 11 is a block diagram of a computer system.

FIG. 11 illustrates a typical computer system that can be used to implement a programmable chip having pipelined scan chains. The computer system 1100 includes any number of processors 1102 (also referred to as central processing units, or CPUs) that are coupled to devices including memory 1106 (typically a random access memory, or "RAM"), memory 1104 (typically a read only memory, or "ROM"). The processors 1102 can be configured to generate a test sequences for any designated processor. As is well known in the art, memory 1104 acts to transfer data and instructions uni-directionally to the CPU and memory 1106 is used typically to transfer data and instructions in a bi-directional manner.

Both of these memory devices may include any suitable type of the computer-readable media described above. A mass storage device 1108 is also coupled bi-directionally to CPU 1102 and provides additional data storage capacity and may include any of the computer-readable media described above. The mass storage device 1108 may be used to store programs, data and the like and is typically a secondary storage medium such as a hard disk that is slower than memory. The mass storage device 1108 can be used to hold a library or database of prepackaged logic or intellectual property functions, as well as information on generating particular configurations. It will be appreciated that the information retained within the mass storage device 1108, may, in appropriate cases, be incorporated in standard fashion as part of memory 1106 as virtual memory. A specific mass storage device such as a CD-ROM 1114 may also pass data uni-directionally to the CPU.

CPU 1102 is also coupled to an interface 1110 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 1102 optionally may be coupled to a computer or telecommunications network using a network connection as shown generally at 1112. With such a network connection, it is contemplated that the CPU might receive information from the network, or might output information to the network in the course of performing the above-described method steps. It should be noted that the system 1100 may also be associated with devices for transferring completed designs onto a programmable chip. The above-described devices and materials will be familiar to those of skill in the computer hardware and software arts.

The hardware elements described above may be configured to act as multiple software modules for performing the operations of this invention. For example, instructions for running a generator program, input stage (e.g., a wizard), and/or compiler may be stored on mass storage device 1108 or 1114 and executed on CPU 1102 in conjunction with primary memory 1106.

While the invention has been particularly shown and described with reference to specific embodiments thereof, it will be understood by those skilled in the art that changes in the form and details of the disclosed embodiments may be made without departing from the spirit or scope of the invention. For example, multiple scan chains each having a different number of registers may be used to construct a pipeline of any desired depth. For another example, any number of access ports (including just one access port) may be associated with a scan chain. It is therefore intended that the invention be interpreted to include all variations and equivalents that fall within the true spirit and scope of the present invention.

I claim:

1. A method for scan testing logic within an integrated circuit, the method comprising:

shifting input test data into multiple input-side scan chains in parallel, wherein at least two input-side scan chains are on different levels of a pipeline;

applying the input test data from the multiple input-side scan chains to the logic under test;

capturing output test data from the logic under test into multiple output-side scan chains, wherein at least two output-side scan chains are on different levels of the pipeline, the output test data being the result of the input test data being applied to the logic under test; and shifting the output test data out from the multiple output-side scan chains in parallel.

2. The method of claim 1, wherein the input-side scan chains on different pipeline levels are interconnected.

3. The method of claim 2, wherein the output-side scan chains on different pipeline levels are interconnected.

4. The method of claim 3, wherein each of the input-side and output-side scan chains comprises a plurality of registers.

5. The method of claim 4, wherein at least one input-side or output-side scan chain is associated with another logic within the integrated circuit that is not in the scan path.

6. The method of claim 4, wherein at least one input-side or output-side scan chain share a pair of access ports.

7. The method of claim 4, wherein the plurality of registers of an input-side scan chain and an output-side scan chain are part of a common scan chain.

8. The method of claim 4, wherein either applying the input test data from the multiple input-side scan chains to the logic under test or capturing output test data out from the logic under test in multiple output-side scan chains comprises:

shifting test data synchronously on a clock cycle.

9. The method of claim 8, wherein either applying the input test data from the multiple input-side scan chains to the logic under test or capturing output test data out from the logic under test in multiple output-side scan chains comprises:

shifting test data in unison.

10. The method of claim 9, wherein either applying the input test data from the multiple input-side scan chains to the logic under test or capturing output test data out from the logic under test in multiple output-side scan chains comprises:

shifting test data between scan chains.

11. The method of claim 10, wherein either applying the input test data from the multiple input-side scan chains to the logic under test or capturing output test data out from the logic under test in multiple output-side scan chains comprises:

shifting test data between registers.

12. The method of claim 1, wherein applying the input test data from the multiple input-side scan chains to the logic under test comprises:

applying at least a portion of the input test data through a first logic different from the logic under test.

13. The method of claim 12, wherein capturing the output test data from the logic under test in multiple output-side scan chains comprises:

applying at least a portion of the output test data through a second logic different from the logic under test.

14. The method of claim 1, further comprising:

extracting pipeline information from the integrated circuit to identify the multiple input-side and output-side scan chains associated with the logic under test.

15. The method of claim 1, wherein the integrated circuit is implemented in either an ASIC or an ASSP.

16. The method of claim 1, wherein the integrated circuit is implemented in a programmable device.

17. The method of claim 16, wherein the logic under test is an embedded core.

18. The method of claim 16, further comprising:

constructing the multiple input-side and output-side scan chains with programmable logic and interconnects in the programmable logic device.

19. A method for scan testing logic within an integrated circuit, the method comprising:

shifting input test data into multiple input-side scan chains in parallel, wherein at least two input-side scan chains are on different levels of a pipeline;

applying the input test data from the multiple input-side scan chains to the logic under test;

capturing output test data from the logic under test in multiple output-side scan chains, wherein at least two output-side scan chains are on different levels of the pipeline, the output test data being the result of the input test data being applied to the logic under test;

shifting the output test data out from the multiple output-side scan chains in parallel; and extracting pipeline information from the integrated circuit to account for translation of test data through logic other than the logic under test.

20. An integrated circuit having logic for scan testing, comprising:

a logic under test;

a plurality of input-side scan chains operable to receive input test data in parallel and to make available the input test data for applying to the logic under test, wherein at least two input-side scan chains are on different levels of a pipeline; and a plurality of output-side scan chains operable to receive output test data from the logic under test and to make available the output test data for observation from the output-side scan chains in parallel, wherein at least two output-side scan chains are on different levels of the pipeline.

21. The integrated circuit of claim 20, further comprising:

a plurality of interconnects for connecting the multiple input-side scan chains and the multiple output-side scan chains to the logic under test.

22. The integrated circuit of claim 21, wherein each input-side and output-side scan chain comprises a plurality of registers.

23. The integrated circuit of claim 22, wherein at least one input-side or output-side scan chain is associated with another logic within the integrated circuit that is not in the scan path.

24. The integrated circuit of claim 22, wherein at least one input-side or output-side scan chain share a pair of access ports.

25. The integrated circuit of claim 20, wherein the integrated circuit is implemented in either an ASIC or an ASSP.

26. The integrated circuit of claim 20, wherein the integrated circuit is implemented in a programmable device.

27. The integrated circuit of claim 26, wherein the logic under test is an embedded core.

28. The integrated circuit of claim 20, wherein the input test data comprises multiple input test data vectors and the output test data comprises multiple output test data vectors.

* * * * *